United States Patent
Sun et al.

(10) Patent No.: US 10,453,969 B2
(45) Date of Patent: Oct. 22, 2019

(54) INTEGRATED CIRCUITS WITH MEMORY CELLS AND METHODS FOR PRODUCING THE SAME

(71) Applicant: Globalfoundries Singapore Pte. Ltd., Singapore (SG)

(72) Inventors: Yuan Sun, Singapore (SG); Shyue Seng Tan, Singapore (SG)

(73) Assignee: GLOBALFOUNDRIES SINGAPORE PTE. LTD., Singapore (SG)

(*) Notice: Subject to any disclaimer, the term of this patent is extended or adjusted under 35 U.S.C. 154(b) by 92 days.

(21) Appl. No.: 15/665,888

(22) Filed: Aug. 1, 2017

(65) Prior Publication Data
US 2019/0043992 A1 Feb. 7, 2019

(51) Int. Cl.
| H01L 29/788 | (2006.01) |
|---|---|
| H01L 29/423 | (2006.01) |
| H01L 29/45 | (2006.01) |
| H01L 29/08 | (2006.01) |
| H01L 23/535 | (2006.01) |
| H01L 21/285 | (2006.01) |
| H01L 21/768 | (2006.01) |
| H01L 29/66 | (2006.01) |

(52) U.S. Cl.
CPC .... *H01L 29/7881* (2013.01); *H01L 21/28518* (2013.01); *H01L 21/76895* (2013.01); *H01L 23/535* (2013.01); *H01L 29/0847* (2013.01); *H01L 29/42328* (2013.01); *H01L 29/45* (2013.01); *H01L 29/66825* (2013.01)

(58) Field of Classification Search
CPC ............ H01L 29/42324; H01L 29/788; H01L 29/66825; H01L 27/115; H01L 27/11521; H01L 29/0847

USPC .......................................................... 257/319
See application file for complete search history.

(56) References Cited

U.S. PATENT DOCUMENTS

| 6,326,661 | B1* | 12/2001 | Dormans ............... H01L 27/115 257/314 |
|---|---|---|---|
| 2002/0163032 | A1* | 11/2002 | Lin .................... H01L 21/28273 257/315 |
| 2011/0193156 | A1* | 8/2011 | Dong ................ H01L 21/28273 257/326 |
| 2013/0020626 | A1* | 1/2013 | Tan ................... H01L 27/11521 257/316 |
| 2015/0311221 | A1* | 10/2015 | Huang .................... H01L 29/49 257/314 |
| 2017/0317092 | A1* | 11/2017 | Ho .................... H01L 27/11521 |

OTHER PUBLICATIONS https://www.merriam-webster.com/dictionary/overlie; 2018.*

* cited by examiner

*Primary Examiner* — Nilufa Rahim
(74) *Attorney, Agent, or Firm* — Lorenz & Kopf, LLP

(57) ABSTRACT

Integrated circuits and methods of producing the same are provided. In an exemplary embodiment, an integrated circuit includes a source, a drain, and a channel defined between the source and drain. A memory cell overlies the channel, where the memory cell includes a floating gate and a control gate overlying the floating gate. A block overlies a portion of the drain referred to as a blocked drain region, where the blocked drain region is adjacent to the channel. A drain silicide overlies the drain and terminates at the blocked drain region such that the blocked drain region is between the drain silicide and the channel.

20 Claims, 6 Drawing Sheets

INTEGRATED CIRCUITS WITH MEMORY CELLS AND METHODS FOR PRODUCING THE SAME

TECHNICAL FIELD

The technical field generally relates to integrated circuits with memory cells and methods of producing the same, and more particularly relates to integrated circuits with memory cells resistant to gate induced drain leakage resulting from repeated cycling of the memory cells, and methods of producing the same.

BACKGROUND

Many integrated circuits include memory cells that are repeatedly written to, read, and erased. Each time a memory cell is written to, it is referred to as a "cycle" of that memory cell. Memory cells with floating gates are written to by injecting electrons into the floating gate from a drain. As the memory cell is repeatedly cycled, some electrons may become trapped, or build up, in the area between the drain and the floating gate. This build up of a charge produces a "pseudo" negative gate bias that produces field effects at a substrate surface underlying the floating gate. With repeated cycling, this charge build up produces gate induced drain leakage, and can result in the memory cell failing to save a charge, so the write process fails.

A drain silicide typically overlies the drain and facilitates electrical contact with other components of the integrated circuit. The memory cell is positioned overlying a channel defined between a source and the drain, where the source and drain are utilized in operation of the memory cell. It has been discovered that increasing the distance between the drain silicide and the floating gate reduces the gate induced drain leakage that develops with repeated cycling. Integrated circuits are becoming smaller and smaller as time goes by, and the area of the source may be reduced to the point that increasing the distance between the source silicide and the floating gate results in the source silicide being eliminated or reduced such that good electrical contact is compromised. However, the area of the drain may be larger than that of the source, so there may be more space available on the drain side for increasing the distance between the drain silicide and the floating gate. Production processes tend to be the same for the source silicide and the drain silicide to reduce manufacturing costs, so processes that produce different structures on the drain and the source side are not typical.

Accordingly, it is desirable to provide integrated circuits with memory cells that are resistant to gate induced drain leakage resulting from repeated cycling, and methods for producing the same. In addition, it is desirable to provide integrated circuits with increased distance between the drain silicide and the floating gate, without increasing the distance between the source silicide and the floating gate, and methods of producing the same. Furthermore, other desirable features and characteristics of the present embodiment will become apparent from the subsequent detailed description and the appended claims, taken in conjunction with the accompanying drawings and this background.

BRIEF SUMMARY

Integrated circuits and methods of producing the same are provided. In an exemplary embodiment, an integrated circuit includes a source, a drain, and a channel defined between the source and drain. A memory cell overlies the channel, where the memory cell includes a floating gate and a control gate overlying the floating gate. A block overlies a portion of the drain referred to as a blocked drain region, where the blocked drain region is adjacent to the channel. A drain silicide overlies the drain and terminates at the blocked drain region such that the blocked drain region is between the drain silicide and the channel.

An integrated circuit is provided in another embodiment. The integrated circuit includes a source, a drain, and a channel defined between the source and drain. A memory cell overlies the channel, where the memory cell includes a floating gate and a control gate overlying the floating gate. A drain silicide overlies the drain such that a drain silicide distance is defined from the channel to the drain silicide. A source silicide overlies the source such that a source silicide distance is defined from the channel to the source silicide, and the drain silicide distance is greater than the source silicide distance.

A method of producing an integrated circuit is provided in yet another embodiment. The method includes forming a block overlying a blocked drain region of a drain, where the drain is adjacent to a channel that is defined between the drain and a source. The channel underlies a memory cell, where the memory cell includes a floating gate and a control gate overlying the floating gate. A drain silicide is formed overlying the drain, where the drain silicide terminates at the blocked drain region such that a drain silicide distance is defined from the drain silicide to the channel. A source silicide is formed overlying the source, where a source silicide distance is defined from the source silicide to the channel, and the drain silicide distance is greater than the source silicide distance.

BRIEF DESCRIPTION OF THE DRAWINGS

The present embodiments will hereinafter be described in conjunction with the following drawing figures, wherein like numerals denote like elements, and wherein:

FIGS. 1 and 2 are different views at one point during fabrication, FIG. 3 is at point prior to FIG. 4 during fabrication, and FIGS. 7 and 8 are at the same point during fabrication where an interlayer dielectric is omitted from FIG. 8 for clarity.

DETAILED DESCRIPTION

The following detailed description is merely exemplary in nature and is not intended to limit the various embodiments or the application and uses thereof. Furthermore, there is no intention to be bound by any theory presented in the preceding background or the following detailed description. Embodiments of the present disclosure are generally directed to integrated circuits and methods for fabricating the same. The various tasks and processes described herein may be incorporated into a more comprehensive procedure or process having additional steps or functionality not described in detail herein. In particular, various steps in the manufacture of integrated circuits are well-known and so, in the interest of brevity, many conventional steps will only be mentioned briefly herein or will be omitted entirely without providing the well-known process details. In exemplary embodiments described herein, a memory cell is formed overlying a channel between a source and a drain. A block, sometimes referred to as a "silicide block" because it limits the area of a silicide, is formed overlying the drain, but not overlying the source, prior to forming silicides overlying the drain and source. The block increases the distance between a drain silicide and the channel without increasing the distance between a source silicide and the channel.

Figure 1:
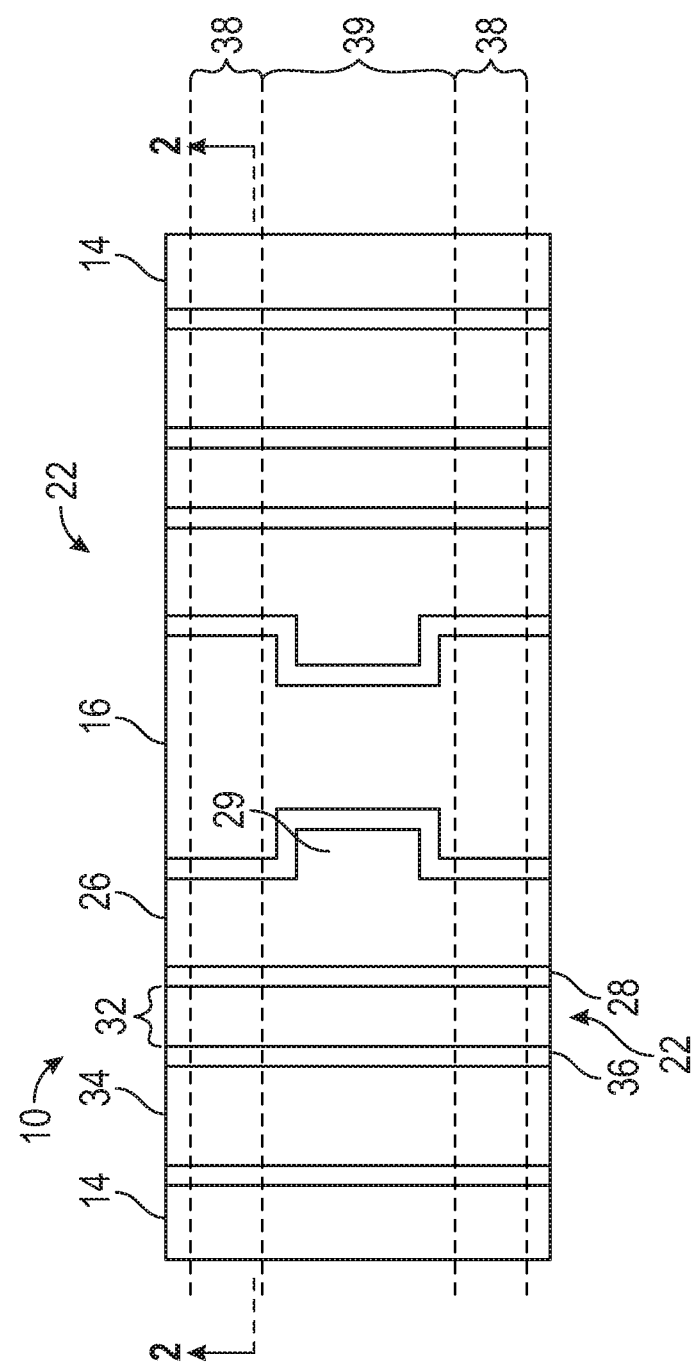
FIGS. 1, 4, and 8 are plan views of an embodiment of an integrated circuit and a method for its fabrication.
Figure 2:
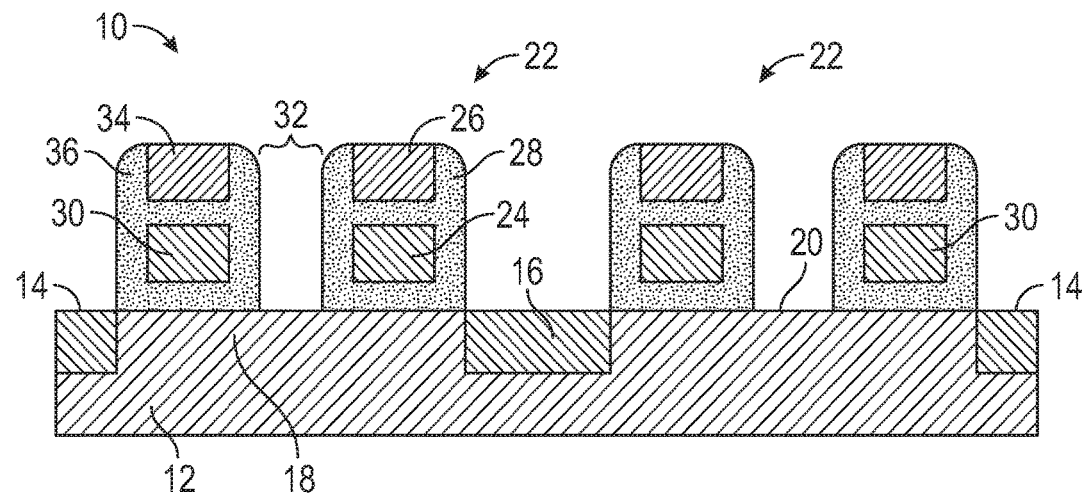
FIGS. 2, 3, and 7 are cross sectional views along lines 2-2 of FIG. 1, line 3-3 of FIG. 4, and line 7-7 from FIG. 8, respectively, where

Reference is made to an exemplary embodiment illustrated in FIGS. 1 and 2, where FIG. 1 is a top view, and FIG. 2 is a side sectional view along line 2-2 in FIG. 1. An integrated circuit 10 includes a substrate 12, where the substrate 12 includes a semiconductor material. As referred to herein, a material that "includes" a recited element/compound includes the recited element/compound in an amount of at least 10 weight percent or more based on the total weight of the material unless otherwise indicated. As used herein, the term "semiconductor material" will be used to encompass semiconductor materials conventionally used in the semiconductor industry to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. In many embodiments, the substrate 12 primarily includes a monocrystalline semiconductor material. As used herein, a component "primarily" includes a material if that material is more than about 50 weight percent of the component. The substrate 12 may be a bulk silicon wafer (as illustrated) or may be a thin layer of semiconductor, such as silicon, on an insulating layer (commonly known as semiconductor- or silicon-on-insulator or SOI, not illustrated) that, in turn, is supported by a carrier wafer.

A source 14 and a drain 16 are defined within the substrate 12 in an exemplary embodiment, where a channel 18 is defined within the substrate 12 between the source 14 and the drain 16. The source 14 and the drain 16 include monocrystalline silicon from the substrate 12, and also include higher concentrations of conductivity determining impurities than the channel 18. In some embodiments, the source 14 and drain 16 also include higher concentrations of conductivity determining impurities than the substrate 12 underlying the source 14 and drain 16, but there may not be a substrate 12 underlying the source 14 and drain 16 in some embodiments such as fully depleted integrated circuits 10 formed on SOI substrates. As used herein, the term "overlying" means "over" such that an intervening layer may lie between the overlying component (the source 14 or drain 16 in this example) and the underlying component (the substrate 12 in this example,) or "on" such that the overlying component physically contacts the underlying component. Moreover, the term "overlying" means a vertical line passing through the overlying component also passes through the underlying component, such that at least a portion of the overlying component is directly over at least a portion of the underlying component. It is understood that the integrated circuit 10 may be moved such that the relative "up" and "down" positions change, so reference to a "vertical" line means a line that is about perpendicular to a substrate surface 20. Generally, the integrated circuit 10 can be operated in any orientation. Spatially relative terms, such as "top", "bottom", "over" and "under" are made in the context of the orientation of the figures. It will be understood that the spatially relative terms are intended to encompass different orientations of the device in use or operation in addition to the orientation depicted in the figures. Thus, the exemplary terms "over" and "under" can each encompass either an orientation of above or below depending upon the orientation of the device. The device may be otherwise oriented (e.g., rotated 90 degrees or at other orientations) and the spatially relative descriptors used herein may likewise be interpreted accordingly.

In an exemplary embodiment, the source 14 and drain 16 are formed by implanting conductivity determining impurities (i.e. dopants) as ions into the upper surface of the substrate 12. The conductivity determining impurities may be either "P" type or "N" type in different embodiments. "P" type conductivity determining impurities typically include boron, aluminum, gallium, and indium, but other materials could also be used. "N" type conductivity determining impurities typically include phosphorous, arsenic, and/or antimony, but other materials could also be used. Ion implantation involves ionizing the conductivity determining impurity and propelling the ion into the substrate 12 under the influence of an electrical field. The source 14 and drain 16 may then annealed to repair crystal damage from the ion implantation process, to electrically activate the conductivity determining impurities, and to redistribute the conductivity determining impurities within the semiconductor material. The annealing process can use widely varying temperatures, such as temperatures ranging from about 500 degrees centigrade (° C.) to about 1,200° C. While the source 14 and drain 16 may be formed by implantation as described, other techniques for doping the source 14 and drain 16 may be utilized.

In an embodiment, a memory cell 22 overlies the channel 18, and an assist gate 30 also overlies the channel 18, where a gate gap 32 is defined between the memory cell 22 and the assist gate 30. The channel 18 includes the substrate 12 between the source 14 and the drain 16, so the memory cell 22, the assist gate 30, and the gate gap 32 all overlie the channel 18. The memory cell 22 includes a floating gate 24 and a control gate 26 overlying the floating gate 24, where the floating gate 24 and the control gate 26 are electrical conductors. As used herein, an "electrically insulating material" or an "electrical insulator" is a material with a resistivity of about $1\times10^4$ ohm meters or more, an "electrically conductive material" or an "electrical conductor" is a material with a resistivity of about $1\times10^{-4}$ ohm meters or less, and an "electrically semiconductive material" or an "electrical semiconductor" is a material with a resistivity of from about more than $1\times10^{-4}$ ohm meters to less than about $1\times10^4$ ohm meters. In an exemplary embodiment, the floating gate 24 and the control gate 26 include polysilicon with conductivity determining impurities at a sufficient concentration to make the floating and control gates 24, 26 electrically conductive.

In the illustrated embodiment, the drain 16 is closer to the memory cell 22 than to the assist gate 30, and the source 14 is closer to the assist gate 30 than to the memory cell 22. However, other embodiments are possible, such as embodiments without an assist gate 30. The memory cell 22 may optionally include tabs 29, as seen in the top view in FIG. 1, where the tabs 29 may improve connectivity at other production stages. In some embodiments, the memory cell 22 includes at least 2 memory cells 22, and the drain 16 is positioned between 2 neighboring memory cells 22. The integrated circuit 10 may also include at least 2 assist gates 30, where the source 14 may be positioned between 2 neighboring assist gates 30 (not illustrated) in a similar manner. In some embodiments, the distance between 2 neighboring memory cells 22 is greater than the distance between the 2 neighboring assist gates 30. The drain 16 is between the 2 neighboring memory cells 22, and the source 14 is between the 2 neighboring assist gates 30, so an area of a surface of the drain 16, measured at the substrate surface 20, is greater than an area of a surface of the source 14, also measured at the substrate surface 20.

A memory cell dielectric 28 encases the floating gate 24 and extends along bottom and side surfaces of the control gate 26. The memory cell dielectric 28 is an electrical insulator, and includes silicon dioxide in an exemplary embodiment. In some embodiments, the memory cell dielectric 28 has varying compositions in different locations. For example, the memory cell dielectric 28 may primarily include silicon dioxide directly underlying the floating gate 24, the memory cell dielectric 28 may primarily include silicon nitride adjacent to the side surfaces of the floating and control gates 24, 26, and the memory cell dielectric 28 may primarily include silicon oxynitride between the floating and control gates 24, 26. However, many different compositions are possible as long as the memory cell dielectric 28 is an electrical insulator, where the composition may or may not vary in different locations within the memory cell dielectric 28.

In the illustrated embodiment, a dummy gate 34 overlies the assist gate 30, and an assist gate dielectric 36 encases the assist gate 30. The assist gate dielectric 36 is an electrical insulator, and may have the same composition as the memory cell dielectric 28 in some embodiments. In alternate embodiments, the assist gate 30 is formed in alternate locations, but there is some space between the assist gate 30 and the memory cell 22. In yet other embodiments the memory cell 22 is present and there is no assist gate 30.

The integrated circuit 10 includes an active area 38 and an isolation area 39, where the isolation area 39 typically includes shallow trench isolation structures (not illustrated) that separate and electrically isolate different memory cells 22. An individual memory cell 22 is positioned within the active area 38, and may be individually accessed with an address defined by an intersection of a bit line and a word line (not illustrated). Different memory cells 22 along a single structure, such as the structure that includes the memory cells 22, are isolated from each other by the isolation area 39, and a single structure may include many active areas 38 and isolation areas 39 in a memory bank area of the integrated circuit 10.

Figure 3:
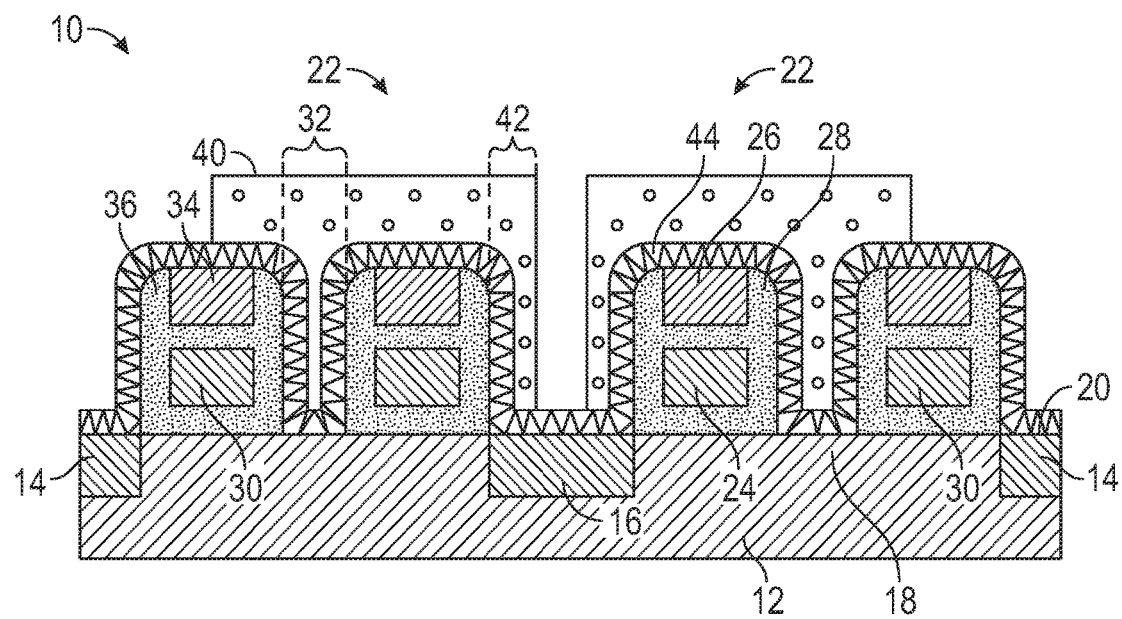
Figure 4:
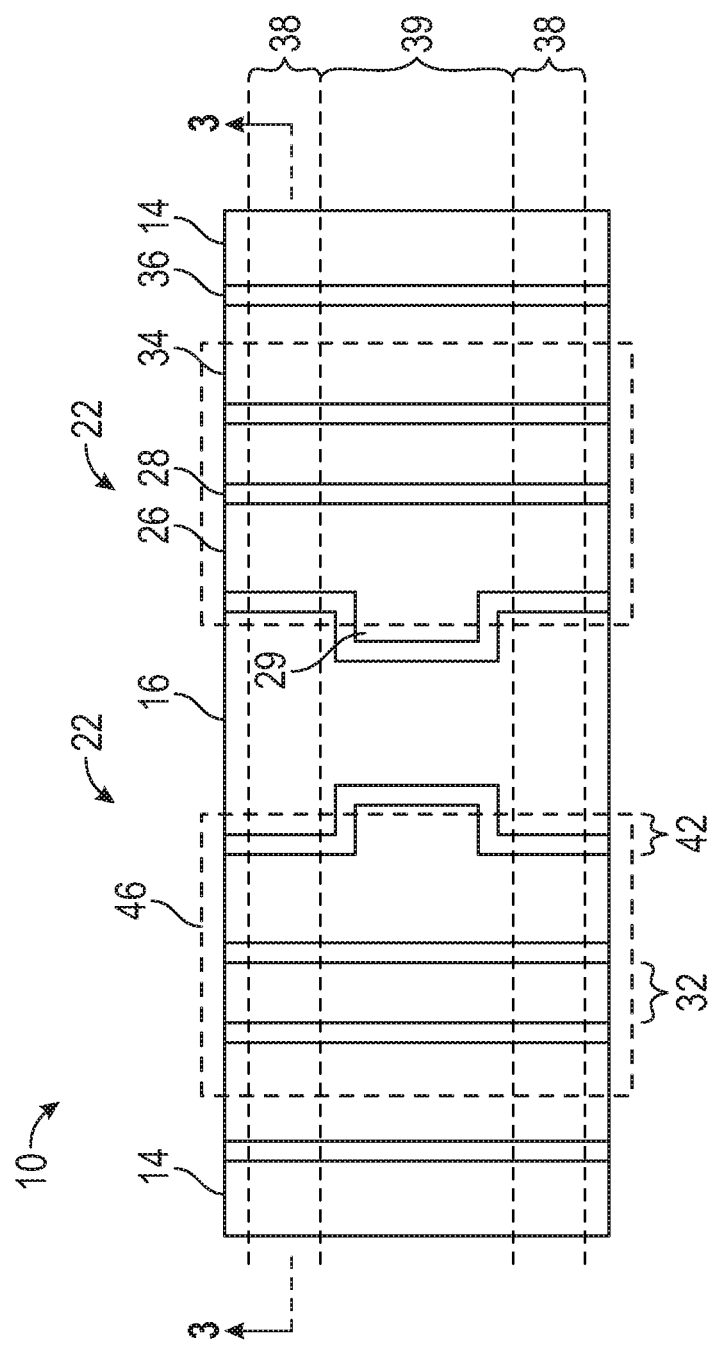
Figure 5:
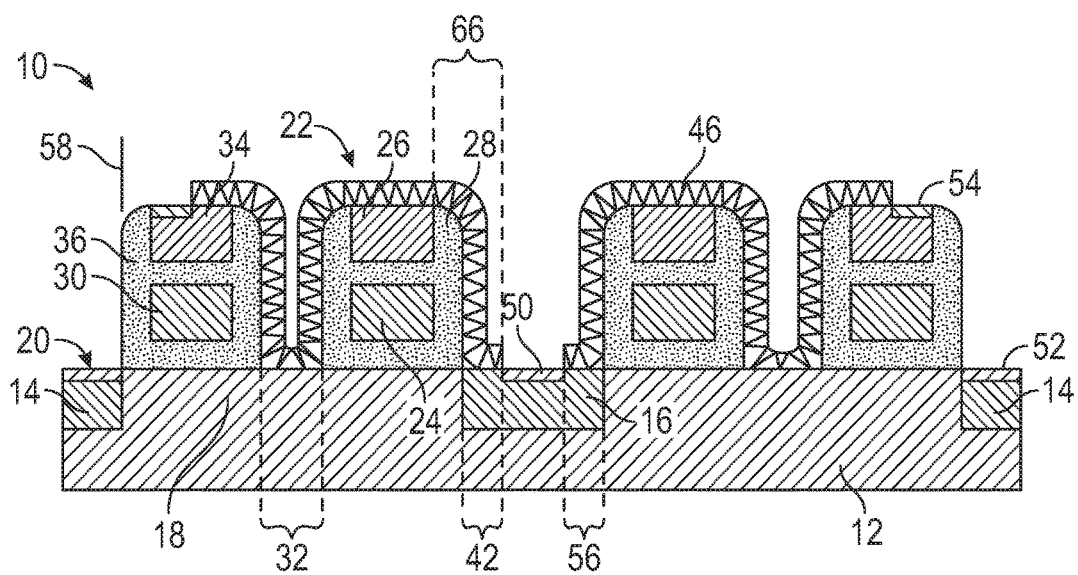
FIGS. 5 and 6 illustrate, in cross sectional views, an integrated circuit and methods of producing the same in accordance with exemplary embodiments.

Reference is now made to FIGS. 3 and 4, where FIG. 4 is a top view and FIG. 3 is a side sectional view taken along line 3-3 from FIG. 4. FIG. 3 illustrates the integrated circuit 10 earlier in the manufacturing process than in FIG. 4. A block photoresist layer 40 is removed between FIGS. 3 and 4, and an etch is performed between FIGS. 3 and 4. FIG. 3 illustrates a block layer 44 that is formed overlying the integrated circuit 10, where the block layer 44 is silicon nitride in an exemplary embodiment. However, one or more of many other materials may be used to form the block layer 44 in alternate embodiments. The block photoresist layer 40 is formed and patterned overlying the block layer 44 such that a portion of the drain 16 adjacent to the channel 18 is covered by the block photoresist layer 40, but a central portion of the drain 16 is exposed (not covered) by the block photoresist layer 40. The portion of the drain 16 that is covered is a blocked drain region 42. The source 14 is exposed (not covered) by the block photoresist layer 40. The block layer 44 illustrated in FIG. 3 is removed in the areas exposed by the block photoresist layer 40 to form a block 46, as illustrated in FIGS. 4 and 5. The block 46 is the portion of the block layer 44 that underlies the block photoresist layer 40 and that remains after the exposed portions of the block layer 44 are removed. An appropriate etchant for the material of the block layer 44 is used to remove the exposed portions of the block layer 44 and form the block 46, such as a wet etch with dilute phosphoric acid in embodiments where the block layer primarily includes silicon nitride. However, other etchants and/or etch techniques are utilized in alternate embodiments. In the illustrated embodiment with at least 2 memory cells 22, the integrated circuit 10 also includes at least 2 blocks 46. The single drain 16 positioned between the 2 memory cells 22 includes 2 blocked drain regions 42 that underlie the 2 blocks 46, where each of the two neighboring memory cells 22 is associated with one block 46 and one blocked drain region 42.

The block photoresist layer 40 (and other photoresist layers described below) may be deposited by spin coating, and patterned by exposure to light or other electromagnetic radiation through a mask with transparent sections and opaque sections. The light causes a chemical change in the photoresist such that either the exposed portion or the non-exposed portion can be selectively removed. The desired locations may be removed with an organic solvent, and the block photoresist layer 40 remains overlying the other areas of the integrated circuit 10. The block photoresist layer 40 (and other photoresist layers described below) may optionally include a top and/or bottom anti-reflective coating and/or a hard mask (not illustrated). Many anti-reflective coatings are available, including inorganic and organic compounds, such as titanium nitride or organosiloxanes. Titanium nitride may be deposited by chemical vapor deposition using tetramethylamidotitanium and nitrogen trifluoride, and organosiloxanes may be deposited by spin coating. Anti-reflective coatings may improve the accuracy and critical dimensions during photoresist patterning. Silicon nitride may be used as a hard mask, where silicon nitride can be formed by low pressure chemical vapor deposition using ammonia and dichlorosilane.

In the embodiment illustrated in FIG. 4, the block 46 (illustrated in dashed lines with underlying structures also illustrated) overlies the memory cell 22 (excluding portions of the tabs 29), the gate gap 32, and a portion of the assist gate 30, as well as the portion of the channel 18 underlying the memory cell 22, the gate gap 32, and the covered portion of the assist gate 30. These areas may be covered by the block 46 as a result of lithographic limitations, because a smaller block 46 that only covers the blocked drain region 42 may be beyond lithographic resolution capabilities. However, in some embodiments, the block 46 may cover a smaller area than as illustrated as long as the block 46 overlies the blocked drain region 42. Other techniques for forming the block 46, or for preventing formation of a silicide overlying the blocked drain region 42, are utilized in alternate embodiments. For example, a metal layer is deposited prior to formation of silicides, and a portion of that metal layer overlying the blocked drain region 42 may be removed with lithography and a selective etch to prevent formation of a silicide overlying the blocked drain region 42. Other techniques that prevent formation of a silicide over the blocked drain region 42 are also possible.

FIG. 5 illustrates an embodiment where a drain silicide 50, a source silicide 52, and a dummy gate silicide 54 are formed overlying the drain 16, the source 14, and the dummy gate 34, respectively. A thin layer of metal is deposited on the exposed surfaces, such as by sputtering or chemical vapor deposition, and the silicides are formed by a subsequent anneal. In an exemplary embodiment, nickel (Ni) is deposited and then annealed at a first temperature of about 240° C. to about 320° C. for about 10 to about 40 seconds, followed by a second anneal at about 400° C. to about 500° C. for about 20 to about 40 seconds to form nickel silicide. Other metals can be used, and the annealing process is adjusted for the selected metal. A wet etch is then used to selectively remove the nickel overburden, which does not react with materials other than silicon. For example, nickel can be selectively etched with a mixture of nitric acid, acetic acid, and sulfuric acid. The drain silicide 50 overlies the drain 16, but the drain silicide 50 is not part of the drain 16. The source silicide 52 overlies the source 14, but is not a part of the source 14, and the dummy gate silicide 54 overlies the dummy gate 34, but is not a part of the dummy gate 34. The drain silicide 50 terminates at the blocked drain region 42, so the blocked drain region 42, which is adjacent to the channel 18 in an exemplary embodiment, is positioned between the channel 18 and the drain silicide 50.

As can be seen, the source silicide 52 is closer to the channel 18 than to the drain silicide 50 is, because the blocked drain region 42 is between the drain silicide 50 and the channel 18. A drain silicide distance 56 is the distance between the drain silicide 50 and the channel 18, and a source silicide distance 58 is the distance between the source silicide 52 and the channel 18. As mentioned above, the drain silicide distance 56 is greater than the source silicide distance 58. In the illustrated embodiment, the source silicide distance 58 is about 0 nanometers (nm), such as about from about 0 to about 50 nm, but the source silicide distance 58 may be greater in alternate embodiments. For example, the source 14 may include a halo or other extension that underlie the assist gate 30 and/or the assist gate dielectric 36, and this portion of the source 14 may separate the source silicide 52 from the channel 18 by a small distance. The block 46 overlies the blocked drain region 42, and this increases the drain silicide distance 56 and it also increases the distance between the drain silicide 50 and the floating gate 24. The increase in the drain silicide distance 56 and/or the increase in the distance between the drain silicide 50 and the floating gate 24 tends to reduce gate induced drain leakage resulting from repeated cycling of the memory cell 22. A GIDL distance 66 is the sum of the drain silicide distance 56 and a distance underlying the memory cell dielectric 28 between the drain 16 and the floating gate 24. The GIDL distance 66 influences the gate induced drain leakage, where larger GIDL distances 66 produce reduced gate induced drain leakage. The gate induced drain leakage is much more significant on the drain side of the memory cell 22 than the source side due to a higher voltage bias in embodiments where the source 14 is grounded.

Figure 6:
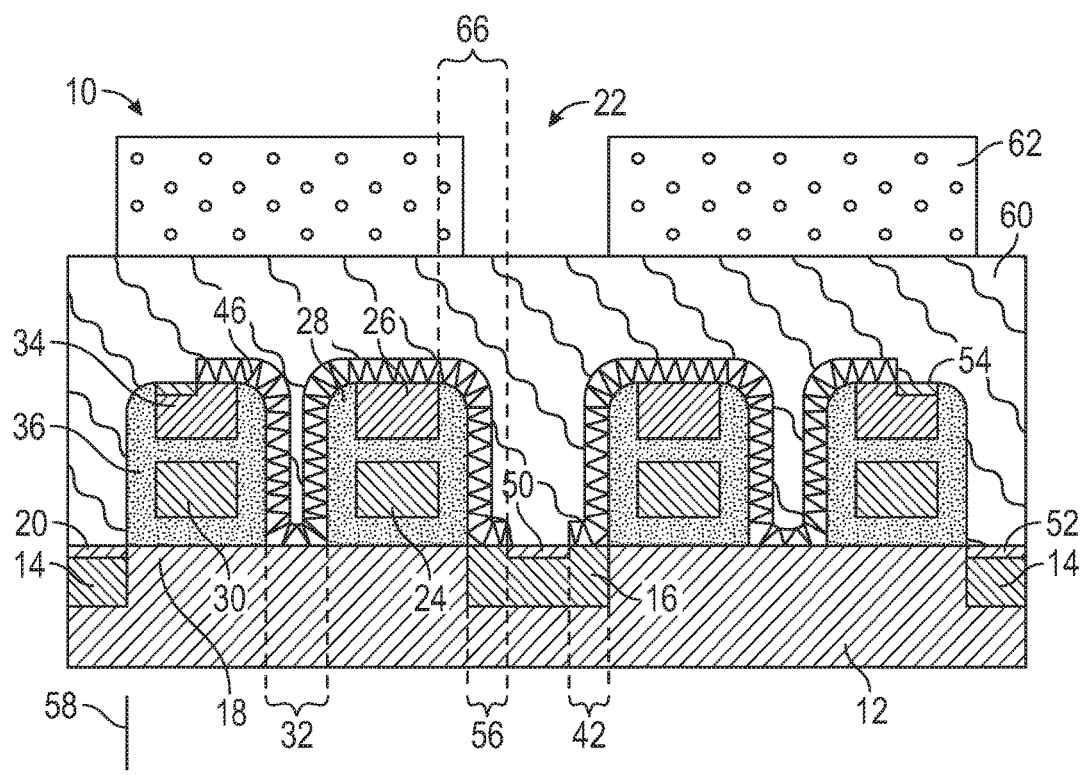

An interlayer dielectric 60 is formed overlying the integrated circuit 10, including the memory cell 22, the source 14 and drain 16, and the assist gate 30, as illustrated in an exemplary embodiment in FIG. 6. The interlayer dielectric 60 may include a wide variety of electrically insulating materials in various embodiments. For example, un-doped silicate glass (USG), silicon nitride, silicon oxynitride, silicon dioxide, low K dielectric materials, or combinations thereof may be used. In an exemplary embodiment, silicon dioxide is deposited by chemical vapor deposition using silane and oxygen, but other techniques and/or materials are utilized in alternate embodiments. A via photoresist layer 62 is formed and patterned overlying the interlayer dielectric 60, where the via photoresist layer 62 is patterned to expose areas where contacts will be formed. In the illustrated embodiment, these exposed areas include areas overlying the source silicide 52 and the drain silicide 50.

Figure 7:
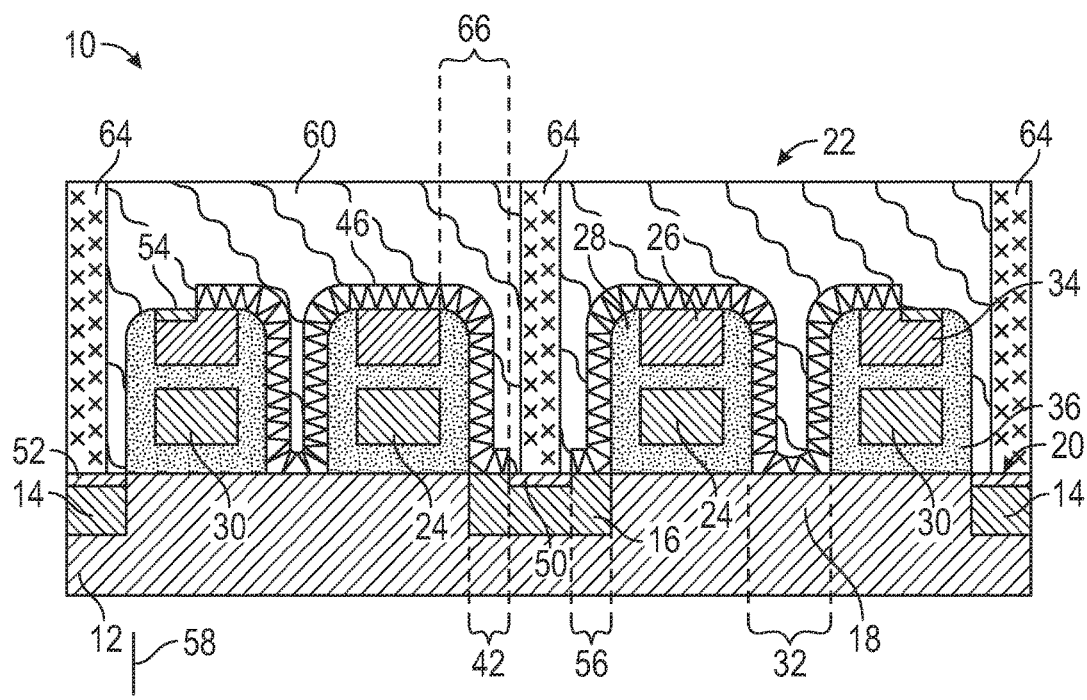

FIG. 7 illustrates an embodiment where contacts 64 are formed through the interlayer dielectric 60 to the source and drain silicides 52, 50. Vias are etched through the interlayer dielectric 60 to the drain and source silicides 50, 52 with an etchant selective to the material of the interlayer dielectric 60. In an exemplary embodiment with an interlayer dielectric primarily including silicon dioxide, a dry reactive etch with chlorine and hydrogen bromide is used, but many other etchants are possible. The vias are then filled with material to form the contacts 64. In an exemplary embodiment, the contacts 64 include an adhesion layer, a barrier layer, and a plug (not individually illustrated,) which are sequentially deposited. For example, an adhesion layer of titanium is formed by low pressure chemical vapor deposition of titanium pentachloride, a barrier layer of titanium nitride is formed by chemical vapor deposition of titanium tetrabromide and ammonia, and a plug of tungsten is formed by chemical vapor deposition of tungsten hexafluoride and hydrogen. Other types of contacts are also possible, such as copper or other electrically conductive materials.

Figure 8:
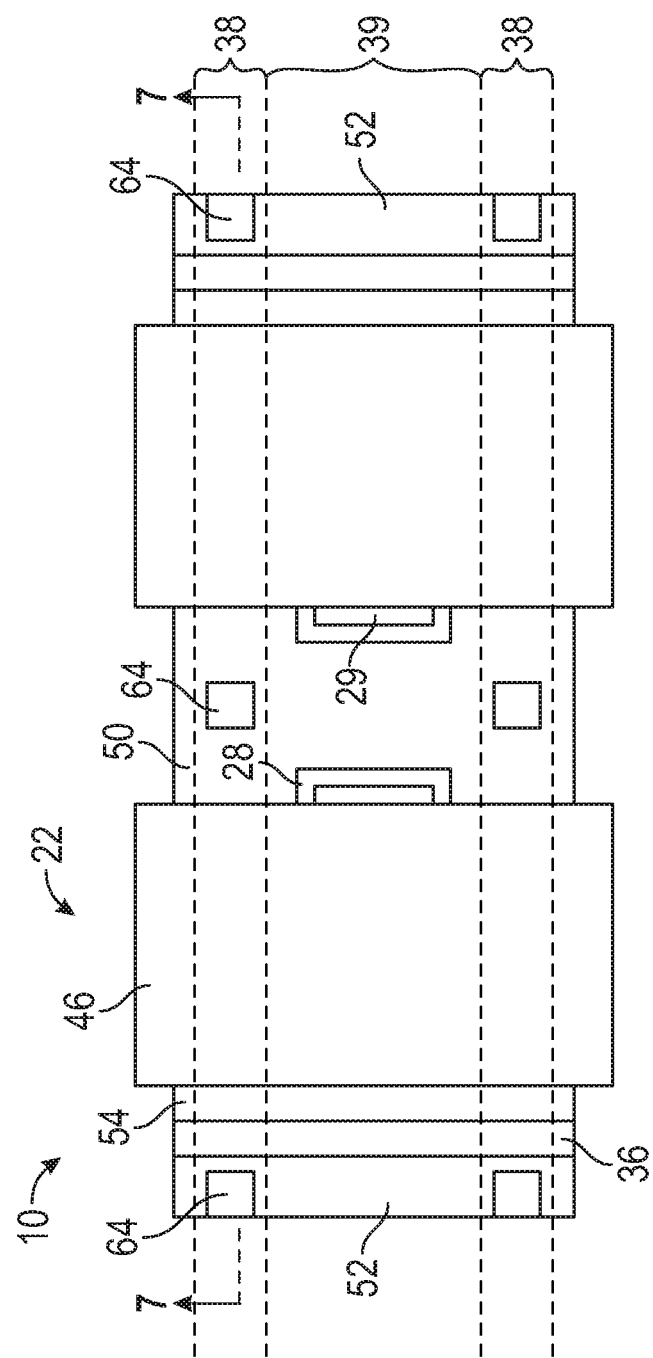

FIG. 8 is a top view of an embodiment where the interlayer dielectric 60 has been removed for illustration purposes, with continuing reference to FIG. 7. The tabs 29 of the memory cell 22 are not covered by the block 46 in the illustrated embodiment, but the optional tabs 29 may be omitted or covered by the block 46 in alternate embodiments. Electrical connections to the assist gate 30 and the control gate 26 (where the electrical connections are not illustrated, and the assist and control gates 30, 26 are visible in FIG. 7) may be made through the dummy gate 34 and block 46, as appropriate, in areas other than along the cross section illustrated in FIG. 7. The use of the block 46 to increase the drain silicide distance 56 and the distance between the drain silicide 50 and the floating gate 24 reduces gate induced drain leakage, as mentioned above, and does not reduce the surface area of the source silicide 52 for access with the contacts 64.

While at least one exemplary embodiment has been presented in the foregoing detailed description, it should be appreciated that a vast number of variations exist. It should also be appreciated that the exemplary embodiments are only examples, and are not intended to limit the scope, applicability, or configuration of the application in any way. Rather, the foregoing detailed description will provide those skilled in the art with a convenient road map for implementing one or more embodiments, it being understood that various changes may be made in the function and arrangement of elements described in an exemplary embodiment without departing from the scope, as set forth in the appended claims.

What is claimed is:

1. An integrated circuit comprising:
   a source;
   a drain;
   a channel defined between the source and the drain;
   an assist gate overlying the channel;
   a memory cell comprising a floating gate and a control gate overlying the floating gate, wherein the memory cell overlies the channel;
   a memory cell dielectric encasing the floating gate;
   a block overlying a portion of the drain, wherein the portion of the drain underlying the block is a blocked drain region, and wherein the blocked drain region is adjacent to the channel, and wherein the block overlies the control gate and at least a portion of the assist gate, and wherein the block does not overlie the source;

a drain silicide overlying the drain, wherein the drain silicide terminates at the blocked drain region such that the blocked drain region is between the drain silicide and the channel;

an interlayer dielectric overlying the block; and a contact passing through the interlayer dielectric to the drain silicide.

2. The integrated circuit of claim 1 further comprising a source silicide overlying the source, wherein the channel is closer to the source silicide than to the drain silicide.

3. The integrated circuit of claim 2
wherein the assist gate and the memory cell define a gate gap between the assist gate and the memory cell.

4. The integrated circuit of claim 3 wherein the block overlies the channel at the gate gap.

5. The integrated circuit of claim 3 wherein the block overlies the memory cell dielectric.

6. The integrated circuit of claim 3 wherein:
the drain is closer to the memory cell than to the assist gate; and
the source is closer to the assist gate than to the memory cell.

7. The integrated circuit of claim 3 further comprising:
a dummy gate overlying the assist gate.

8. The integrated circuit of claim 1 wherein the block comprises silicon nitride.

9. The integrated circuit of claim 1 wherein:
the memory cell comprises at least 2 memory cells, wherein the drain is positioned between the at least 2 memory cells.

10. The integrated circuit of claim 9 wherein:
the block comprises at least 2 blocks, the drain comprises at least 2 blocked drain regions, and wherein the at least 2 blocks overlie the at least 2 blocked drain regions of the drain.

11. The integrated circuit of claim 1 wherein a drain silicide distance is a distance between the drain silicide and the channel, and wherein a gate induced drain leakage (GIDL) distance is a sum of the drain silicide distance and a distance underlying the memory cell dielectric between the drain and the floating gate, and wherein the GIDL distance is greater than the drain silicide distance.

12. An integrated circuit comprising:
a source;
a drain;
a channel defined between the source and the drain;
an assist gate overlying the channel;
a memory cell comprising a floating gate and a control gate overlying the floating gate, wherein the memory cell overlies the channel;
a memory cell dielectric encasing the floating gate;
a block overlying a portion of the drain, wherein the portion of the drain underlying the block is a blocked drain region, and wherein the blocked drain region is adjacent to the channel;
wherein the block overlies the control gate and at least a portion of the assist gate, and wherein the block does not overlie the source;
a drain silicide overlying the drain, wherein the drain silicide terminates at the blocked drain region such that the blocked drain region is between the drain silicide and the channel, wherein a drain silicide distance is a distance between the drain silicide and the channel, and wherein a gate induced drain leakage (GIDL) distance is a sum of the drain silicide distance and a distance underlying the memory cell dielectric between the drain and the floating gate, and wherein the GIDL distance is greater than the drain silicide distance;

an interlayer dielectric overlying the block; and a contact formed through the interlayer dielectric to the drain silicide.

13. The integrated circuit of claim 12 further comprising:
a dummy gate overlying the assist gate.

14. The integrated circuit of claim 13 wherein:
the drain is closer to the memory cell than to the assist gate; and
the source is closer to the assist gate than to the memory cell.

15. The integrated circuit of claim 13 wherein the memory cell and the assist gate define a gate gap between the memory cell and the assist gate.

16. The integrated circuit of claim 15 wherein the block overlies the channel at the gate gap.

17. The integrated circuit of claim 12 wherein the block overlies the memory cell dielectric.

18. The integrated circuit of claim 12 wherein the interlayer dielectric overlies the memory cell, the source, and the drain.

19. The integrated circuit of claim 18
wherein the block comprises silicon nitride.

20. A method of producing an integrated circuit comprising:
forming a memory cell comprising a floating gate and a control gate, wherein the floating gate is encased in a memory cell dielectric, and wherein the control gate overlies the floating gate;

forming a block overlying a blocked drain region of a drain, wherein the drain is adjacent to a channel that is defined between the drain and a source, wherein the channel underlies the memory cell, wherein the block overlies the control gate of the memory cell, and wherein the block overlies the memory cell dielectric, and wherein the block does not overlie the source;

forming an assist gate overlying the channel, wherein the block overlies at least a portion of the assist gate;

forming a drain silicide overlying the drain, wherein the drain silicide terminates at the blocked drain region such that a drain silicide distance is defined from the drain silicide to the channel; and forming a source silicide overlying the source, wherein a source silicide distance is defined between the source silicide and the channel, and wherein the drain silicide distance is greater than the source silicide distance;

forming an interlayer dielectric overlying the block, the drain silicide, and the source silicide; and forming a contact through the interlayer dielectric to the drain silicide.

* * * * *